(12) United States Patent
Huang et al.

(10) Patent No.: US 10,903,326 B2
(45) Date of Patent: Jan. 26, 2021

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chun-Sung Huang, Changhua County (TW); Shen-De Wang, Hsinchu County (TW); Chia-Ching Hsu, Yunlin County (TW); Wang Xiang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/246,538

(22) Filed: Jan. 13, 2019

(65) Prior Publication Data

US 2020/0227531 A1    Jul. 16, 2020

(51) Int. Cl.
*H01L 29/423* (2006.01)
*H01L 29/792* (2006.01)
*H01L 29/40* (2006.01)

(52) U.S. Cl.
CPC ...... *H01L 29/42344* (2013.01); *H01L 29/401* (2013.01); *H01L 29/42376* (2013.01); *H01L 29/792* (2013.01)

(58) Field of Classification Search
CPC ............. H01L 29/42344; H01L 29/401; H01L 29/42376; H01L 29/792
See application file for complete search history.

(56) References Cited

U.S. PATENT DOCUMENTS

| 5,851,881 A | 12/1998 | Lin et al. |
| 7,416,945 B1 | 8/2008 | Muralidhar et al. |
| 8,178,406 B2 * | 5/2012 | Kang ................. H01L 27/115 257/366 |
| 9,165,652 B2 | 10/2015 | Kang et al. |
| 2007/0218633 A1* | 9/2007 | Prinz ................. B82Y 10/00 438/267 |
| 2009/0108325 A1* | 4/2009 | Kang ................. H01L 27/115 257/316 |
| 2015/0048439 A1* | 2/2015 | Shum ................. G11C 16/0425 257/326 |
| 2016/0013197 A1* | 1/2016 | Liu ................. H01L 27/1157 257/322 |
| 2016/0293427 A1* | 10/2016 | Mihara ............ H01L 27/11573 |
| 2018/0286875 A1* | 10/2018 | Okada ............. H01L 27/11521 |
| 2019/0296030 A1* | 9/2019 | Okada ............. H01L 29/66545 |

* cited by examiner

*Primary Examiner* — Christine A Enad
(74) *Attorney, Agent, or Firm* — Winston Hsu

(57) ABSTRACT

A method for fabricating semiconductor device includes the steps of: forming a first gate structure on a substrate; forming a second gate structure on the substrate and on one side of the first gate structure; forming a third gate structure on the substrate and on another side of the first gate structure; forming source/drain regions adjacent to the second gate structure and the third gate structure; and forming contact plugs to contact the first gate structure, the second gate structure, the third gate structure, and the source/drain regions.

20 Claims, 6 Drawing Sheets

SEMICONDUCTOR DEVICE AND METHOD FOR FABRICATING THE SAME

BACKGROUND OF THE INVENTION

1. Field of the Invention

The invention relates to a memory device and fabrication method thereof, and more particularly to a silicon-oxide-nitride-oxide-silicon (SONOS) memory and fabrication method thereof.

2. Description of the Prior Art

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased electrically.

Product development efforts in memory device technology have focused on increasing the programming speed, lowering programming and reading voltages, increasing data retention time, reducing cell erasure times and reducing cell dimensions. Some of the flash memory arrays today utilize a gate structure made of dual polysilicon layers (also refers to as the dual poly-Si gate). The polysilicon layer utilized in these gate structures often includes a dielectric material composed of an oxide-nitride-oxide (ONO) structure. When the device is operating, electrons are injected from the substrate into the bottom layer of the dual polysilicon layers for storing data. Since these dual gate arrays typically store only one single bit of data, they are inefficient for increasing the capacity of the memory. As a result, a flash memory made of silicon-oxide-nitride-oxide-silicon (SONOS) is derived. Preferably, a transistor from these memories is capable of storing two bits of data simultaneously, which not only reduces the size of the device but also increases the capacity of the memory significantly. The operation of a typical SONOS memory is described below.

During the programming of a typical SONOS memory, electrical charge is transferred from a substrate to the charge storage layer in the device, such as the nitride layer in the SONOS memory. Voltages are applied to the gate and drain creating vertical and lateral electric fields, which accelerate the electrons along the length of the channel. As the electrons move along the channel, some of them gain sufficient energy to become trapped in the charge storage dielectric material. This jump is known as hot carrier injection, in which the hot carriers being the electrons. Charges are trapped near the drain region as the electric fields are strongest near the drain. Reversing the potentials applied to the source and drain will cause electrons to travel along the channel in the opposite direction and be injected into the charge storage dielectric layer near the source region. Since part of the charge storage dielectric layer are electrically conductive, the charged introduced into these parts of the charge storage dielectric material tend to remain localized. Accordingly, depending upon the application of voltage potentials, electrical charge can be stored in discrete regions within a single continuous charge storage dielectric layer.

However, the ability for trapping and retaining electrical charges under current SONOS architecture is still not perfect, including shortcomings such as insufficient trapping sites for charges as well as easy leakage. Hence how to effective improve the current SONOS architecture to increase the overall performance of the device has become an important task in this field.

SUMMARY OF THE INVENTION

According to an embodiment of the present invention, a method for fabricating semiconductor device includes the steps of: forming a first gate structure on a substrate; forming a second gate structure on the substrate and on one side of the first gate structure; forming a third gate structure on the substrate and on another side of the first gate structure; forming source/drain regions adjacent to the second gate structure and the third gate structure; and forming contact plugs to contact the first gate structure, the second gate structure, the third gate structure, and the source/drain regions.

According to another aspect of the present invention, a semiconductor device includes: a first gate structure on a substrate and a source/drain region adjacent to two sides of the first gate structure; a second gate structure on the substrate and on one side of the first gate structure; a third gate structure on the substrate and on another side of the first gate structure; and contact plugs contacting the first gate structure, the second gate structure, the third gate structure, and the source/drain region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
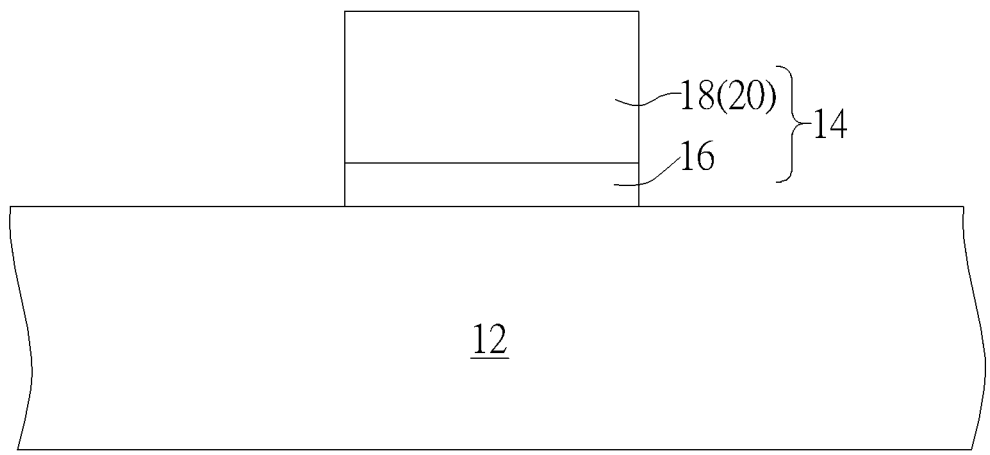
FIGS. 1-6 illustrate a method for fabricating SONOS memory according to an embodiment of the present invention.

Referring to FIGS. 1-6, FIGS. 1-6 illustrate a method for fabricating semiconductor device, or more specifically a SONOS memory according to an embodiment of the present invention. As shown in FIG. 1, a substrate 12 such as a semiconductor substrate preferably made of silicon or silicon-on-insulator (SOI) substrate is provided and at least a gate structure 14 is formed on the substrate 12. Preferably, the formation of the gate structure 14 could be accomplished by first forming a gate dielectric layer 16 on the substrate 12, forming a gate layer 18 on the gate dielectric layer 16, and a photo-etching process is conducted to remove part of the gate layer 18 and part of the gate dielectric layer 16 to form the gate structure 14 on the substrate 12. Specifically, the gate structure 14 includes a gate dielectric layer 16 on the substrate 12 and a patterned gate layer 18 serving as gate electrode 20 on the gate dielectric layer 16, in which the gate dielectric layer 16 is made of silicon oxide and the gate electrode 20 is made of polysilicon. It should be noted that the gate electrode 20 formed at this stage is preferably referred to as a select gate (SG).

Figure 2:
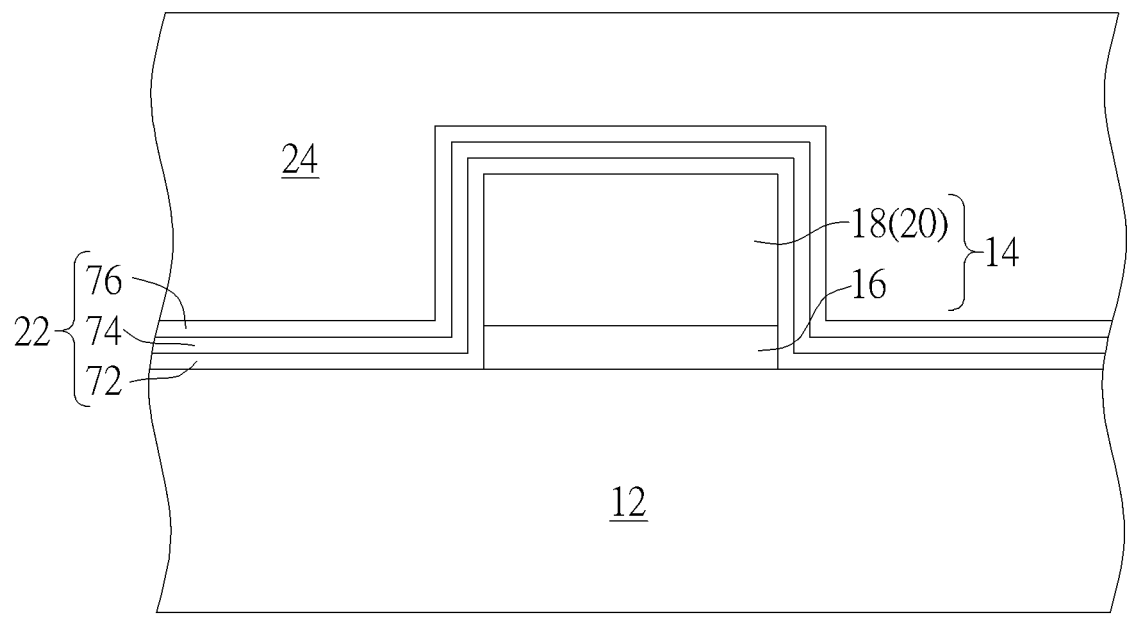

Next, as shown in FIG. 2, another gate dielectric layer 22 is conformably formed on the surface of the substrate 12 and sidewalls and top surface of the gate structure 14, including sidewalls of the patterned gate dielectric layer 16 and gate electrode 20 and top surface of the gate electrode 20, and another gate electrode layer 24 is formed on the gate dielectric layer 22 thereafter. Preferably, the gate dielectric layer 22 and the gate dielectric layer 16 formed in FIG. 1 are made of different materials, in which the gate dielectric layer 22 formed on top of the gate structure 14 is preferably made of an oxide-nitride-oxide (ONO) layer including a silicon oxide layer 72, a silicon nitride layer 74, and another silicon oxide layer 76. The gate layer 24 and the gate electrode 20 formed previously however could be made of same material such as polysilicon.

Figure 3:
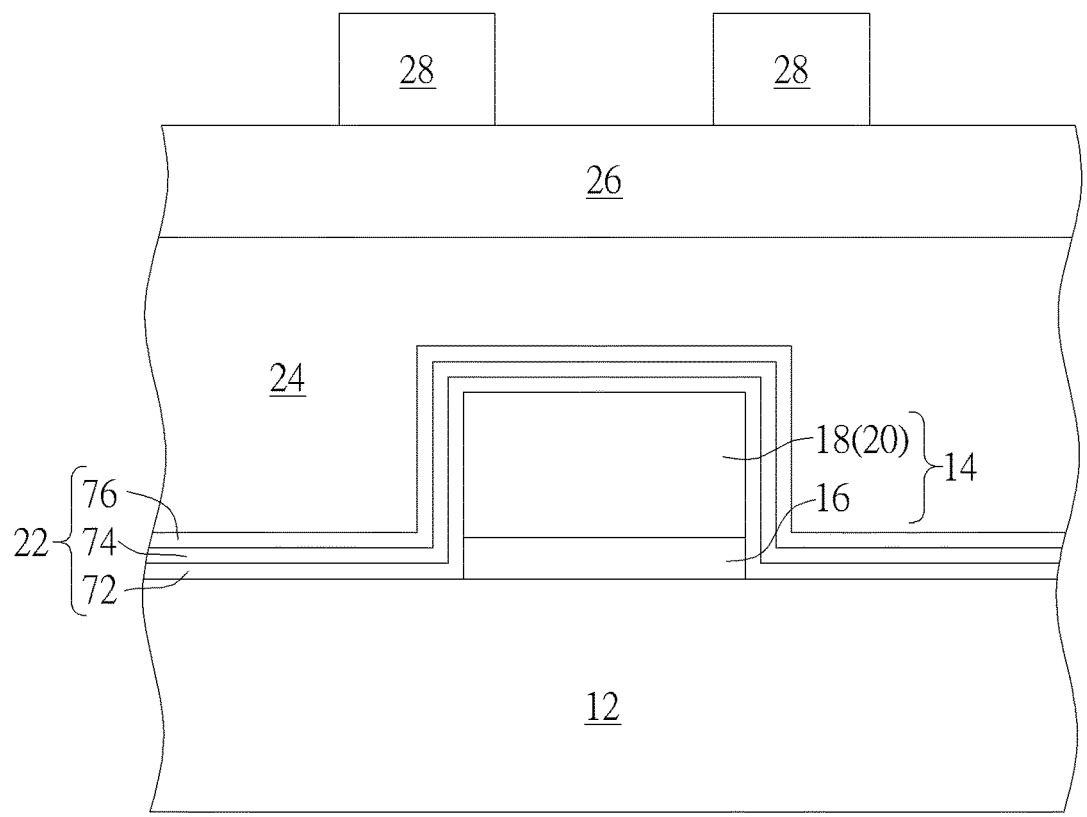

Next, as shown in FIG. 3, a hard mask 26 preferably made of silicon oxide is formed on the surface of the gate layer 24 to cover the gate layer 24 entirely and a patterned mask 28 such as a patterned resist is formed on the hard mask 26 thereafter, in which the patterned mask 28 preferably includes openings exposing part of the surface of the hard mask 26.

Figure 4:
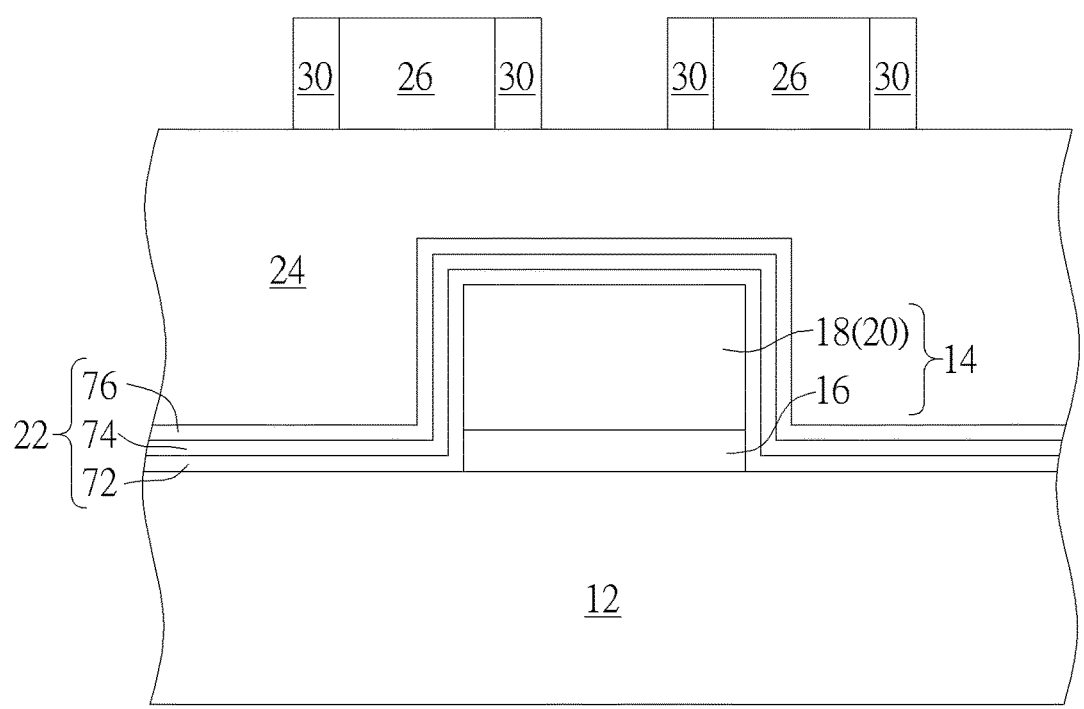

Next, as shown in FIG. 4, an etching process could be conducted by using the patterned mask 28 as mask to remove part of the hard mask 26 and selective spacers 30 could be formed on the sidewalls of the patterned hard mask 26 thereafter. Preferably, the formation of the selective spacers 30 could be accomplished by first forming a liner (not shown) on the surface of the gate layer 24 and sidewalls and top surface of the patterned hard mask 26, and an etching back process could be conducted to remove part of the liner to form the selective spacers 30.

Figure 5:
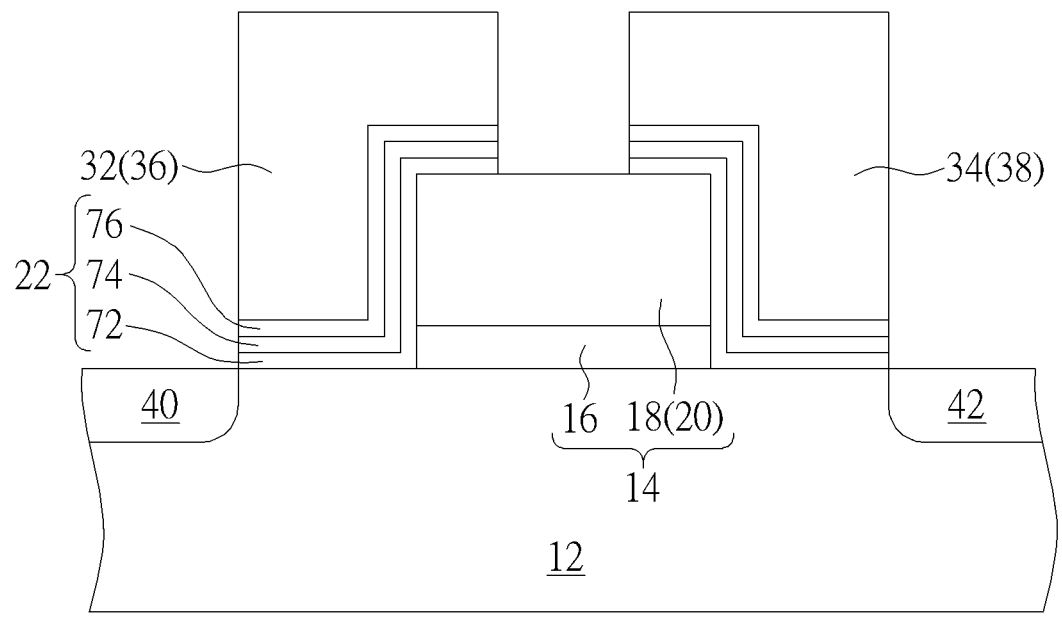

Next, as shown in FIG. 5, another etching process could be conducted by using the patterned hard mask 26 and spacers 30 as mask to remove part of the gate layer 24 and part of the gate dielectric layer 22 to forma gate structure 32 on one side of the gate structure 14 and another gate structure 34 on another side of the gate structure 14. Preferably, the gate structure 32 is further made of a patterned gate layer 24 serving as gate electrode 36 and the gate structure 34 is made of a patterned gate layer 24 serving as gate electrode 38. Specifically, the silicon nitride layer 74 of the patterned gate dielectric layers 22 formed at this stage could function as a floating gate or charge trapping layer and the gate structures 32, 34 formed at this stage are referred to as control gates.

It should be noted that even though a pattern transfer process involving the utilization of spacers 30 is disclosed in this embodiment to form the gate structures 32, 34, according to another embodiment of the present invention, it would also be desirable to skip the formation of the spacers 30 shown in FIG. 4 by directly using the patterned resist 28 as mask to remove part of the hard mask 26, part of the gate layer 24, and part of the gate dielectric layer 22 to form the gate structures 32, 34, which is also within the scope of the present invention.

After the gate structures 32, 34 are formed, an optional spacer (not shown) could be formed on sidewalls of the gate structures 32, including sidewalls of the gate electrodes 36, 38 and gate dielectric layer 22, and an ion implantation process is conducted by implanting dopants into the substrate 12 adjacent to two sides of the gate structures 32, 34 to form source/drain regions 40, 42, in which the source/drain regions 40, 42 could include n-type or p-type dopants depending on the demand of the product. It should be noted that even though the source/drain regions 40, 42 are preferably formed after forming the gate structures 32, 34 in this embodiment, according to an embodiment of the present invention, it would also be desirable to conduct an ion implantation process to form the source/drain regions 40, 42 adjacent to two sides of the gate structure 14 immediately after the gate structure 14 is formed in FIG. 1, and process shown in FIGS. 2-6 are conducted thereafter, which is also within the scope of the present invention.

Figure 6:
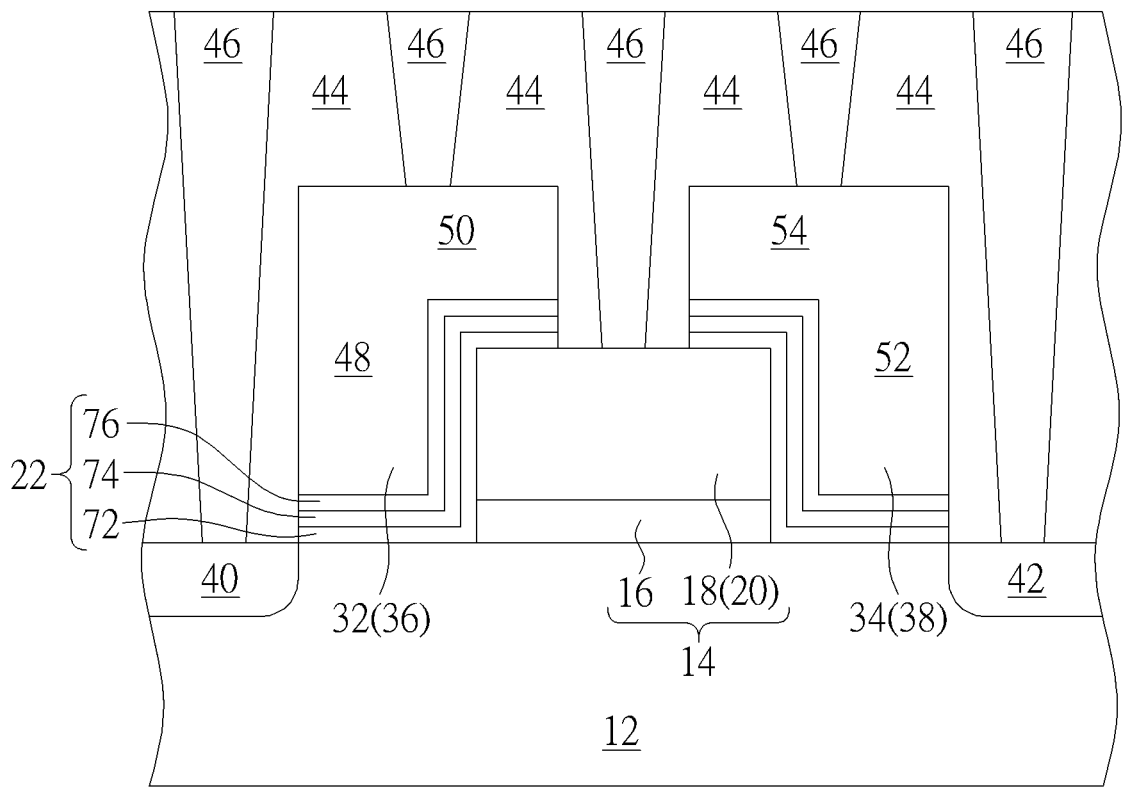

Next, as shown in FIG. 6, a dielectric layer or more specifically an interlayer dielectric (ILD) layer 44 is formed on the substrate 12 to cover the gate structures 32, 34, and a pattern transfer process could be conducted by using a patterned mask (not shown) to remove part of the ILD layer 44 adjacent to the gate structures 32, 34 to form contact holes (not shown) exposing the source/drain region 40, 42 underneath. Next, metals such as a barrier layer including Ti, TiN, Ta, TaN, or combination thereof and a metal layer including W, Cu, Al, TiAl, CoWP, or combination thereof could be deposited into the contact holes, and a planarizing process such as CMP is conducted to remove part of the metals to form contact plugs 46 electrically connecting the source/drain regions 40, 42. This completes the fabrication of a SONOS memory according to an embodiment of the present invention.

Referring again to FIG. 6, FIG. 6 further illustrates a structural view of a SONOS memory according to an embodiment of the present invention. As shown in FIG. 6, the SONOS memory preferably includes a gate structure 14 on a substrate 12, a gate structure 32 disposed on the substrate 12 and on one side of the gate structure 14, a gate structure 34 disposed on the substrate 12 and on another side of the gate structure 14, a source/drain region 40 disposed in the substrate 12 immediately adjacent to the gate structure 32, another source/drain region 42 disposed in the substrate 12 immediately adjacent to the gate structure 34, and contact plugs 46 in the ILD layer 44 to electrically connect or physically contacting the gate structures 14, 32, 34 and the source/drain regions 40, 42 directly.

Preferably, the gate structure 14 is made of a gate dielectric layer 16 disposed on the substrate 12 and a gate electrode 20 dispose don the gate dielectric layer 16, the gate structure 32 overlapping one side of the gate structure 14 is made of a gate electrode 36 disposed on one side of the gate structure 14, and the gate structure 34 overlapping another side of the gate structure 14 is made of a gate electrode 38 disposed on another side of the gate structure 14. A patterned gate dielectric layer 22 is disposed between the gate electrode 36 and the gate structure 14 and another patterned gate dielectric layer 22 is disposed between the gate electrode 38 and the gate structure 14.

Viewing from a more detailed perspective, the gate electrode 36 of the gate structure 32 includes a L-shape which further includes a vertical portion 48 and a horizontal portion 50, in which a sidewall or side edge of the vertical portion 48 is aligned with an outer sidewall of the gate dielectric layer 22 while a sidewall or side edge of the horizontal portion 50 is aligned with an inner sidewall of the gate dielectric layer 22 directly on top of the gate structure 14.

Similarly, the gate electrode 38 of the gate structure 34 includes another L-shape which further includes a vertical portion 52 and a horizontal portion 54, in which the two L-shapes of the gate electrodes 36, 38 are preferably mirror images of each other, a sidewall or side edge of the vertical portion 52 is aligned with an outer sidewall of the gate dielectric layer 22 while a sidewall or side edge of the horizontal portion 54 is aligned with an inner sidewall of the gate dielectric layer 22 directly on top of the gate structure 14.

Figure 7:
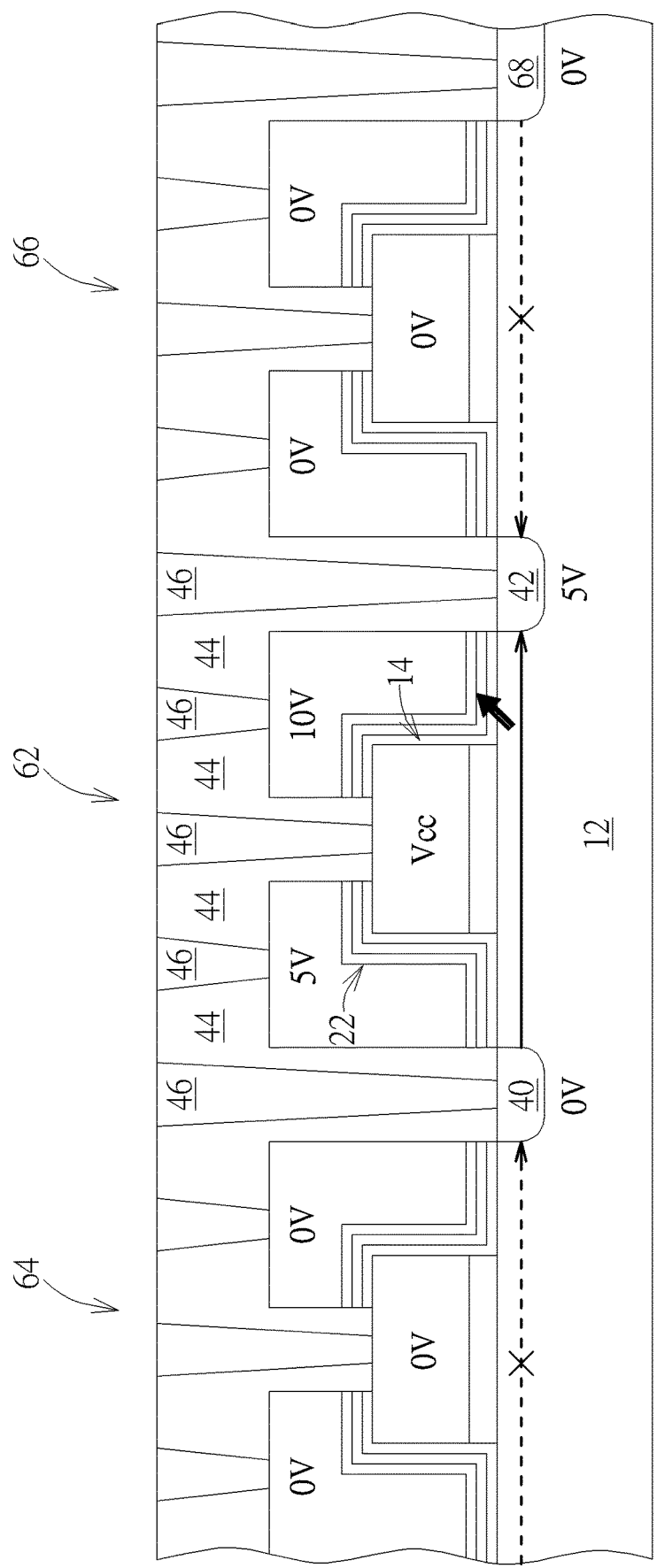
FIG. 7 illustrates a programming mode of a SONOS memory according to an embodiment of the present invention.
Figure 8:
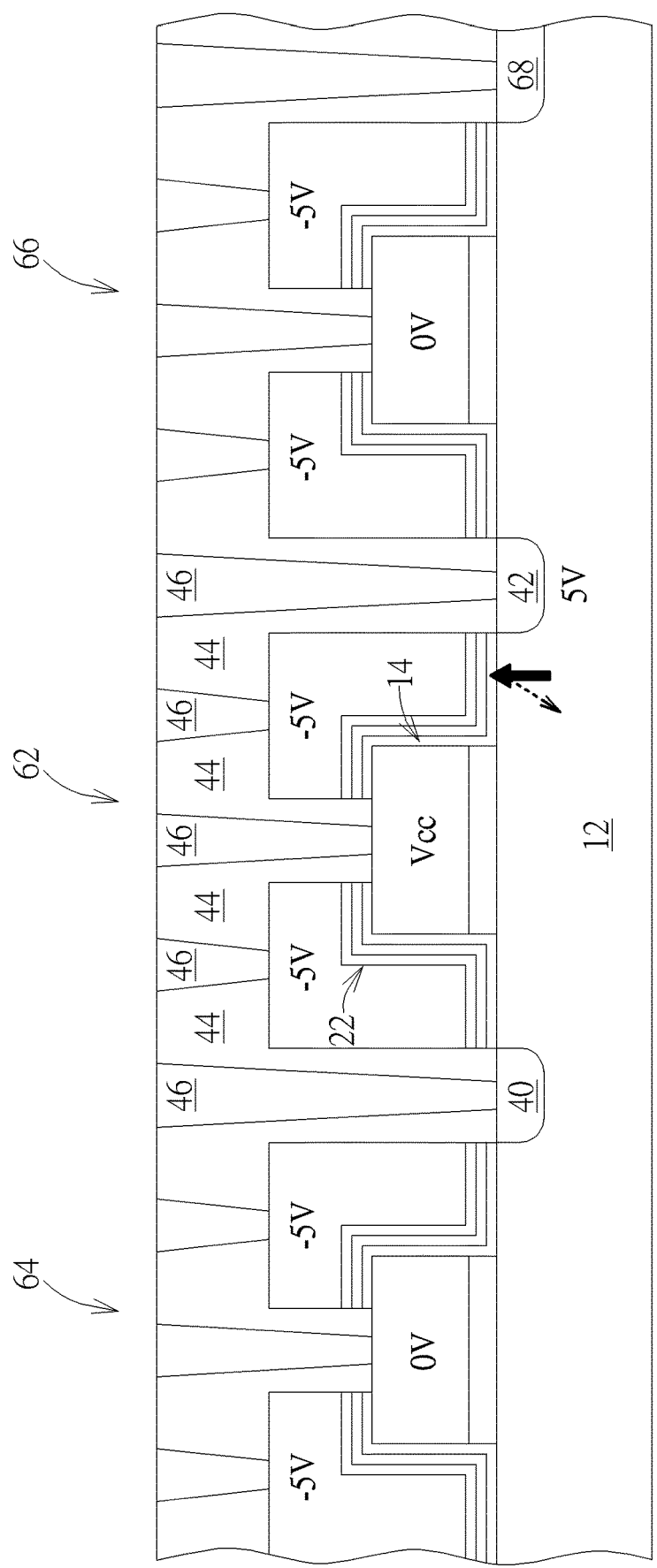
FIG. 8 illustrates an erase mode of a SONOS memory according to an embodiment of the present invention.
Figure 9:
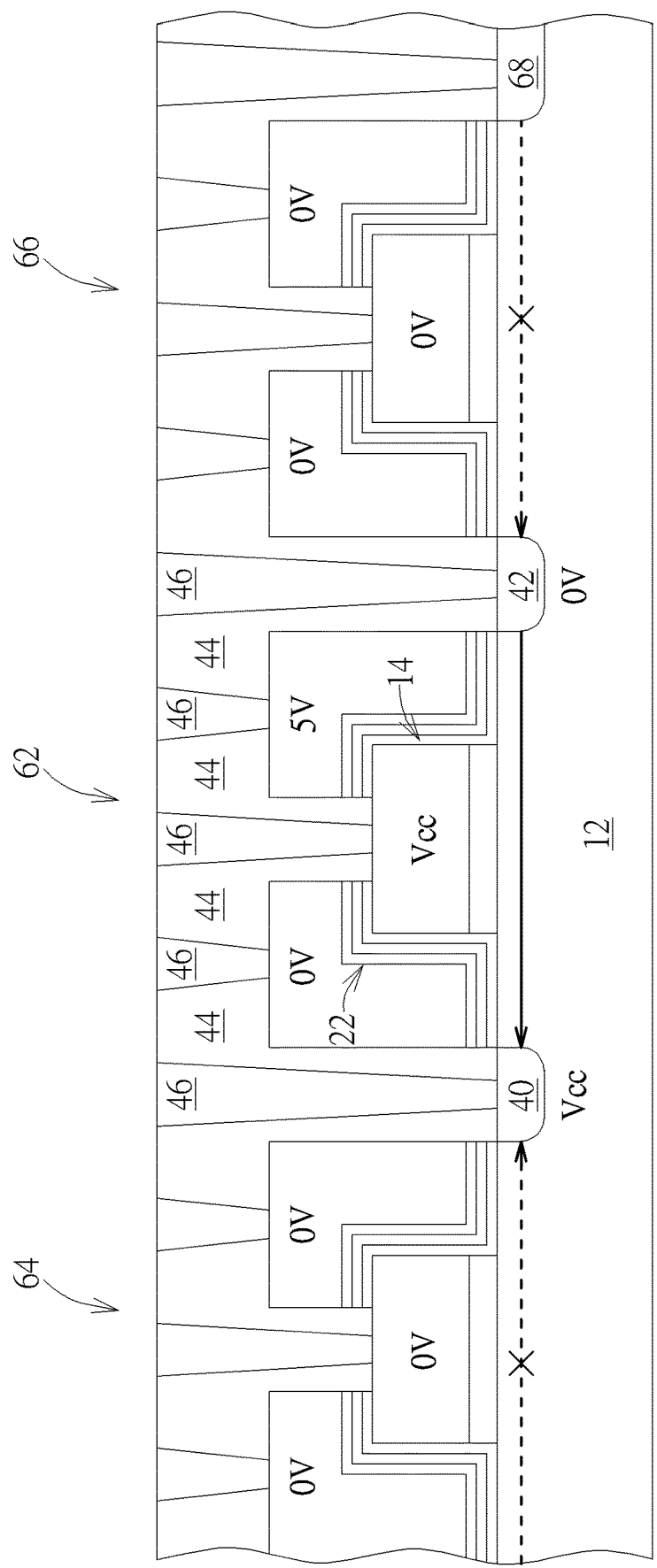
FIG. 9 illustrates a read mode of a SONOS memory according to an embodiment of the present invention.

Referring to FIGS. 7-9, FIGS. 7-9 illustrate operation modes including programming, erase, and read of the SONOS memory according to an embodiment of the present invention. As shown in FIGS. 7-9, three SONOS memory devices 62, 64, 66 are provided to illustrate each of the operations through the passage of hot charges such as electrons or holes, in which the three SONOS memory devices 62, 64, 66 are fabricated through the same process as disclosed in FIGS. 1-6 sharing identical elements including gate structures 14, 32, 34 and source/drain regions 40, 42. Preferably, the memory device in the center is the main cell while the two memory devices on adjacent two sides are reference cell units. For simplicity purpose, elements such as gate electrode are not labeled in the following figures.

As shown in FIG. 7, a programming operation by source side injection (SSI) could be accomplished by applying 5 volts to the left gate electrode 36 of the SONOS memory 62, applying 10 volts to the right gate electrode 38 of the SONOS memory 62, applying a voltage Vcc to the gate structure 14, applying 0 volts to the gate electrodes 36, 38 of the SONOS memories 64, 66, applying 0 volts to the source/drain region 40 between the SONOS memories 62, 64, applying 5 volts to the source/drain region 42 between the SONOS memories 62, 66, and applying 0 volts to the source/drain region 68 on the right of the SONOS memory 66. During the programming operation, hot charges such as electrons are preferably sucked in from the source/drain region 40 to source/drain region 42 through the direction of the arrow and stored in the silicon nitride layer 74 of the ONO dielectric layer 22.

As shown in FIG. 8, an erase operation by band-to-band hot hole (BTBHH) injection could be accomplished by applying −5 volts to all of the gate electrodes 36, 38 in the three SONOS memories 62, 64, 66 while maintaining 5 volts to the source/drain region 42 between the SONOS memories 62, 66. Preferably when high voltages were applied to the substrate an erase operation could be achieved by attracting holes through the direction of solid arrow and expel electrons through the direction of dashed arrow.

As shown in FIG. 9, a read operation could be accomplished by applying 0 volts to the left gate electrode 36 of the SONOS memory 62, applying 5 volts to the right gate electrode 38 of the SONOS memory 62, applying 0 volts to the gate electrodes 36, 38 of the SONOS memories 64, 66, and applying 0 volts to the source/drain region 42 between the SONOS memories 62, 66. Suppose no charges were stored on the right side of the SONOS memory 62, the device could be turned on once more when a threshold difference is detected.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a first gate structure on a substrate;
   forming a second gate structure on one side of the first gate structure and covering a top surface of the first gate structure;
   forming a third gate structure on another side of the first gate structure and covering the top surface of the first gate structure;
   forming source/drain regions adjacent to the second gate structure and the third gate structure; and
   forming contact plugs to contact the first gate structure, the second gate structure, the third gate structure, and the source/drain regions, wherein the contact plugs comprise:
      a first contact plug directly contacting the first gate structure;
      a second contact plug directly contacting the second gate structure; and
      a third contact plug directly contacting the third gate structure, wherein a bottom surface of the first contact plug is lower than a bottom surface of the second contact plug and a bottom surface of the third contact plug.

2. The method of claim 1, wherein the first gate structure comprises:
   a first gate dielectric layer on the substrate; and
   a first gate electrode on the first gate dielectric layer.

3. The method of claim 2, further comprising:
   forming a second gate dielectric layer on the substrate and the first gate structure;
   forming a gate layer on the second gate dielectric layer; and
   removing part of the gate layer and part of the second gate dielectric layer to form the second gate structure and the third gate structure.

4. The method of claim 3, wherein the gate layer comprises polysilicon.

5. The method of claim 3, wherein the second gate structure comprises:
   a second gate electrode on one side of the first gate structure.

6. The method of claim 5, wherein the second gate electrode comprises a first L-shape.

7. The method of claim 6, wherein the first L-shape comprises a first vertical portion and a first horizontal portion and an edge of the first vertical portion is aligned with an edge of the second gate dielectric layer.

8. The method of claim 3, wherein the third gate structure comprises:
   a third gate electrode on another side of the first gate structure.

9. The method of claim 8, wherein the third gate electrode comprises a second L-shape.

10. The method of claim 9, wherein the second L-shape comprises a second vertical portion and a second horizontal portion and an edge of the second vertical portion is aligned with an edge of the second gate dielectric layer.

11. The method of claim 3, further comprising:
    forming a patterned mask on the gate layer;
    forming a spacer around the patterned mask; and
    using the patterned mask and the spacer to remove part of the gate layer and part of the second gate dielectric layer to form the second gate structure and the third gate structure.

12. The method of claim 3, wherein the first gate dielectric layer and the second gate dielectric layer comprise different materials.

13. The method of claim 3, wherein the first gate dielectric layer comprises silicon oxide.

14. The method of claim 3, wherein the second gate dielectric layer comprises an oxide-nitride-oxide (ONO) layer.

15. A semiconductor device, comprising:
a first gate structure on a substrate;
a second gate structure on one side of the first gate structure and covering a top surface of the first gate structure;
a third gate structure on another side of the first gate structure and covering the top surface of the first gate structure;
source/drain regions adjacent to the second gate structure and the third gate structure; and
contact plugs contacting the first gate structure, the second gate structure, the third gate structure, and the source/drain regions, wherein the contact plugs comprise:
  a first contact plug directly contacting the first gate structure;
  a second contact plug directly contacting the second gate structure; and
  a third contact plug directly contacting the third gate structure, wherein a bottom surface of the first contact plug is lower than a bottom surface of the second contact plug and a bottom surface of the third contact plug.

16. The semiconductor device of claim 15, wherein the first gate structure comprises:
a first gate dielectric layer on the substrate; and
a first gate electrode on the first gate dielectric layer.

17. The semiconductor device of claim 16, wherein the second gate structure comprises:
a second gate electrode on one side of the first gate structure.

18. The semiconductor device of claim 17, further comprising a second gate dielectric layer between the second gate electrode and the first gate structure, wherein the second gate electrode comprises a first L-shape, the first L-shape comprises a first vertical portion and a first horizontal portion, and an edge of the first vertical portion is aligned with an edge of the second gate dielectric layer.

19. The semiconductor device of claim 16, wherein the third gate structure comprises:
a third gate electrode on another side of the first gate structure.

20. The semiconductor device of claim 19, further comprising a third gate dielectric layer between the third gate electrode and the first gate structure, wherein the second gate electrode comprises a second L-shape, the second L-shape comprises a second vertical portion and a second horizontal portion, and an edge of the second vertical portion is aligned with an edge of the third gate dielectric layer.

* * * * *